United States Patent [19]

Wiley

[11] Patent Number: 4,854,038
[45] Date of Patent: Aug. 8, 1989

[54] MODULARIZED FABRICATION OF HIGH PERFORMANCE PRINTED CIRCUIT BOARDS

[75] Inventor: John P. Wiley, Vestal, N.Y.

[73] Assignee: International Business Machines Corporation, Armonk, N.Y.

[21] Appl. No.: 168,947

[22] Filed: Mar. 16, 1988

[51] Int. Cl.⁴ .......................... H05K 3/36; H05K 1/14
[52] U.S. Cl. ...................... 29/830; 361/414; 174/68.5; 333/238
[58] Field of Search ................ 174/68.5, 110 F, 36; 428/901; 361/412, 414; 29/830; 333/238, 1

[56] References Cited

U.S. PATENT DOCUMENTS

| | | | |
|---|---|---|---|
| 3,305,416 | 2/1967 | Kahan et al. | 156/3 |
| 3,523,037 | 8/1970 | Chellis | 117/119.6 |
| 3,740,678 | 6/1973 | Hill | 333/84 M |
| 3,795,047 | 3/1974 | Abolafia et al. | 29/830 X |
| 3,972,755 | 8/1976 | Misfeldt | 156/3 |
| 4,031,906 | 6/1977 | Varker . | |
| 4,299,873 | 11/1981 | Ogihara et al. | 428/901 X |
| 4,448,804 | 5/1984 | Amelio et al. | 427/98 |
| 4,526,835 | 7/1985 | Takahashi et al. | 428/901 X |
| 4,591,659 | 5/1986 | Leibowitz | 174/68.5 |
| 4,640,866 | 2/1987 | Suzuki | 428/901 X |
| 4,644,093 | 2/1987 | Yoshihara et al. | 174/36 |
| 4,661,301 | 4/1987 | Okada et al. | 264/41 |
| 4,675,789 | 6/1987 | Kuwabara et al. | 361/414 |
| 4,710,854 | 12/1987 | Yamada et al. | 174/68.5 X |
| 4,747,897 | 5/1988 | Johnson | 156/148 |
| 4,755,783 | 7/1988 | Fleischer et al. | 336/84 C |
| 4,755,911 | 7/1988 | Suzuki | 174/68.5 X |

OTHER PUBLICATIONS

IBM Tech. Discl. Bull., vol. 13, No. 7, Dec. 1970, p. 2075, by Cannizzaro et al.
IBM Tech. Discl. Bull., vol. 13, No. 8, Jan. 1971, p. 2296, by Archer et al.
IBM Tech. Discl. Bull, vol. 22, No. 5, Oct. 1979, p. 1799, by Haining et al.

Primary Examiner—Howard N. Goldberg
Assistant Examiner—Carl J. Arbes
Attorney, Agent, or Firm—Pollock, Vande Sande & Priddy

[57] ABSTRACT

The invention features a method of fabricating a printed circuit board using a modular technique. Sub-assemblies are first constructed, tested, and then subsequently incorporated into the final circuit board assembly which has a triplate geometry. Lamination of the modular sub-assemblies minimizes dielectric core thickness.

15 Claims, 2 Drawing Sheets

MODULARIZED FABRICATION OF HIGH PERFORMANCE PRINTED CIRCUIT BOARDS

FIELD OF THE INVENTION

The invention relates to a fabrication technique for constructing high performance circuit boards, and more particularly to a modularized process for assembling printed circuit boards having a triplate geometry from sub-assemblies.

BACKGROUND OF THE INVENTION

High density printed circuit boards are generally constructed with several electrically conductive layers separated by dielectric layers. Some of the conductive layers are used to supply power and ground voltages. The remaining conductive layers are patterned for electrical signal interconnections among integrated circuit chips. Layer-to-layer interconnections are achieved by means of through-holes plated with electrically conductive material. In high density printed circuit boards it has been normal practice to provide interconnections between adjacent conducting layers, which interconnections are commonly known as "vias".

In U.S. Pat. No. 3,740,678; entitled: Strip Transmission Line Structures; issued: June 19, 1963, a triplate circuit board construction is shown in which X-Y signal planes form a repeating basic core structure in a multi-laminated, high density circuit board.

Such a circuit board construction has been useful in transmitting high frequency signals, and relies upon alternating dielectric mediums to achieve its many benefits.

The aforementioned triplate construction has several drawbacks: (1) it is not a true triplate configuration in which X-Y signal planes are disposed about a conductive power or reference plane; (2) there is no teaching in the above-mentioned patent how vias can be fabricated between individual signal planes embedded as a core within the multi-laminated board structure; (3) if an electrical short should develop within any one of the cores of the assembly, the whole assembly must be discarded. Such electrical short circuits occur with greater prevalence in high performance circuit boards as layers become thinner and signal line density is increased.

SUMMARY OF THE INVENTION

The invention features a method of fabricating high performance printed circuit board assemblies comprising at least two laminated circuitized power plane sub-assemblies. The circuitized power plane sub-assemblies are modular in that they are fabricated in a prior assembly process, and then laminated to other assembly elements as a finished core unit.

One of the advantages to using this type of fabricating technique is that each modular unit can be tested for electrical integrity prior to its integration into the final assembly. Defective circuit board sub-assemblies can be discarded rather than having to discard the completed assembly, as with present techniques. The invention thus provides less waste, and improves reliability.

The assembly of the invention is of true triplate construction, consisting of two laminated sub-assemblies characterized by spaced-apart X-Y signal planes disposed about an internal power plane. Vias run through the core where necessary to provide communication between the X and Y signal planes.

The triplate core is prefabricated as follows:

(i) a first conductive sheet is perforated with a power plane configuration;

(ii) a second conductive sheet is laminated on either side of said first, perforated, conductive sheet to form a core;

(iii) each of the outer conductive sheets of the core is then circuitized to form a first sub-assembly;

(iv) a second sub-assembly is fabricated similarly as the first sub-assembly by repeating steps (i), (ii) and (iii); and (v) the first and second sub-assemblies are then laminated together to produce a triplate construction.

The final circuit board assembly will be comprised of a number of laminated sub-assemblies.

Plated vias are fabricated in the sub-assemblies where necessary.

Still another advantage of the modular technique of the invention is provided by the greater choice of laminating materials. For example, it is intended to reduce the overall dielectric character of the final assembly by laminating the sub-assemblies together using bonding films or an epoxy resin, rather than a glass resin.

High performance is achieved by using the lower dielectrics, which in turn allows for thinner layers and increased wiring density.

These and other advantages and objectives will be better understood with reference to the following detailed description considered in conjunction with the accompanying drawings.

DETAILED DESCRIPTION OF THE INVENTION

In general, the printed circuit board of this invention is constructed using many of the same materials and processes outlined and described in U.S. Pat. No. 4,448,804, issued: May 15, 1984 to Amelio et al, which teaches a technique for plating copper to non-conductive surfaces, such as dielectric materials; U.S. Pat. No. 4,030,190, issued: June 21, 1977 to Varker, which describes a method of forming multilayered printed circuit boards; and U.S. Pat. No. 3,523,037, issued: Aug. 4, 1970 to Chellis, which illustrates a method of fabricating laminate boards that are used to construct multilayered assemblies.

For the sake of brevity, it is desired to incorporate herein, the teachings and description of these materials and processes from the aforementioned patents, all of which are hereby incorporated by reference.

Generally speaking, the invention pertains to a modular technique for fabricating high performance circuit board assemblies.

The assembly has a triplate geometry and comprises modular units having X and Y signal planes disposed on either side of a centralized power plane.

Each sub-assembly has its own vias communicating between the X and Y signal planes, such that when these modular units are laminated into the final circuit board assembly, these vias form internal communicating ducts.

For the purposes of clarity, like elements will have the same designation throughout the figures.

Figure 1:
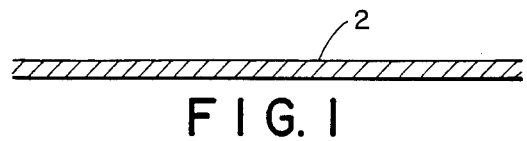
FIG. 1 is a partial sectional view of a raw conductive sheet for use in fabricating the modular sub-assembly of the invention.
Figure 2:
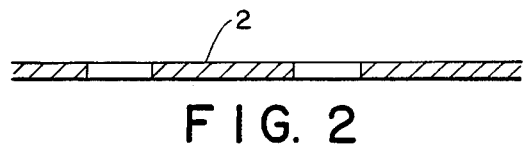
FIG. 2 shows a partial sectional view of the raw conductive sheet of FIG. 1, after being perforated with a power pattern.
Figure 3:
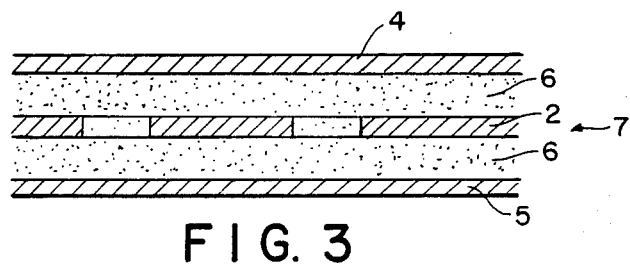
FIG. 3 depicts a partial sectional view of an uncircuitized sub-assembly, formed by the lamination of two conductive sheets about the perforated conductive sheet illustrated in FIG. 2.
Figure 4:
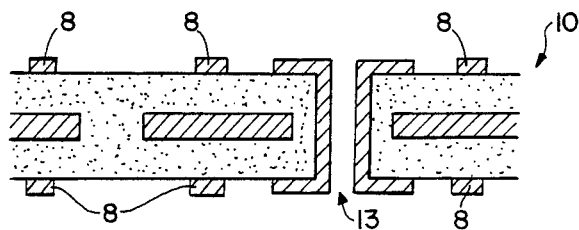
FIG. 4 is a partial sectional view of a finished sub-assembly.

Now referring to FIG. 1, a raw copper sheet is shown in partial sectional view by arrow 2. The raw copper sheet 2 is drilled to provide a power plane configuration as illustrated in FIG. 2. Layered on either side of copper sheet 2 are copper sheets 4 and 5, respectively, which are laminated thereto by a bonding film or a brominated phenoxy resin, as depicted in FIG. 3. This laminate structure forms a raw core 7. In order to fabricate a modular sub-assembly 10 as shown in FIG. 4, the raw core 7 is etched on the two copper sides 4 and 5, respectively, to form X and Y signal pattern 8, as illustrated in FIG. 4. Vias 13 (typical) are drilled where required, and plated to form communicating ducts between the signal planes.

Figure 5:
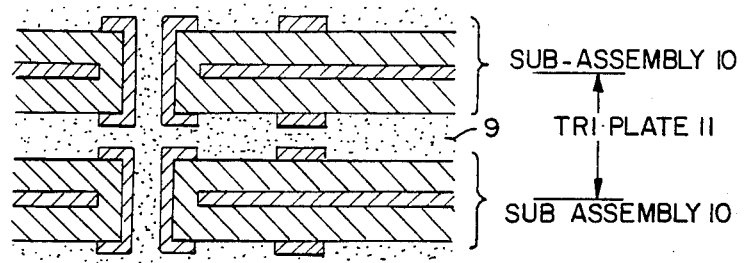
FIG. 5 shows a partial sectional view of a typical triplate circuit board construction comprising two laminated sub-assemblies of FIG. 4.

This etching step is repeated for another similar raw core 7. Two sub-assemblies 10 are laminated together to form a triplate construction 11 as shown in FIG. 5, by means of a sticker sheet 9. Sheet, 9 can comprise a bonding film or an epoxy resin. A low dielectric bonding material is selected to reduce the overall dielectric character of the sub-assembly 10.

The circuitizing of sheets 4 and 5 is accomplished by additive or subtractive techniques known in the art.

Figure 6:
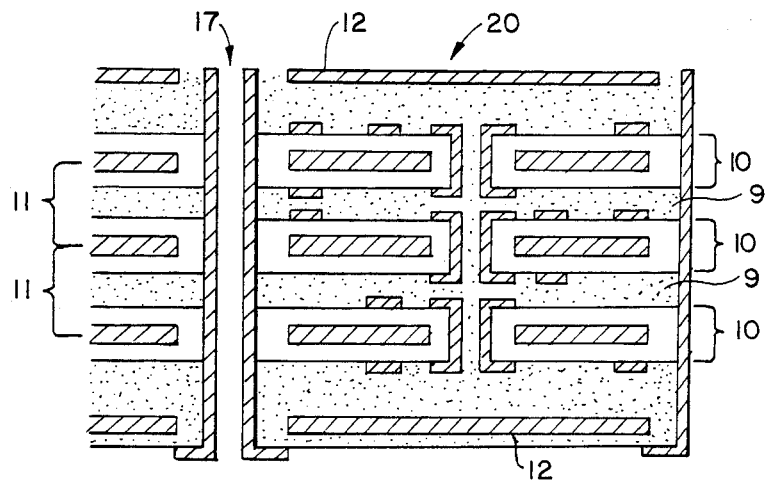
FIG. 6 illustrates a partial sectional view of a final printed circuit board assembly utilizing within its construction a plurality of sub-assemblies of FIG. 4, which have been laminated together.

Referring to FIG. 6, a final circuit board assembly is illustrated by arrow 20.

The circuit board assembly 20 comprises at least two sub-assemblies 10, as shown. Sub-assemblies 10 can be laminated together by a sticker sheet 9 of low dielectric-strength bonding material.

Reference planes 12 can be laminated about the joined sub-assemblies 10, and appropriate plated through-holes 17 will be added to complete assembly 20.

Figure 7:
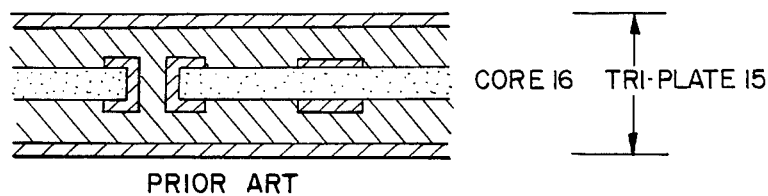
FIG. 7 depicts a partial sectional view of a typical prior art.

Referring to FIG. 7, a prior art triplate construction 15, is shown. A dielectric core 16 of considerable thickness is required in this construction.

One of the advantages of the modularly fabricated triplate construction 11 of the invention is that the thickness of the dielectric laminate 9 is reduced in comparison with that of core 16.

One of the other advantages of constructing an assembly 20 by the modularized method of this invention is the ability to electrically test each sub-assembly 10 before it is laminated into the final circuit board assembly 20. In this manner, only defective sub-assemblies 10 are discarded, rather than entire assembly 20.

Except for the special methodology of the modularized technique of this invention, all construction steps used herein are within the state of the art. Obvious variations or modifications which would be within the inventive scope are considered to be part of the invention, as presented by the subsequently appended claims.

Having described the invention, what is desired to be protected by Letters Patent is presented by the following claims.

What is claimed is:

1. A high performance printed circuit board assembly, comprising at least two modularized circuitized power plane sub-assemblies adjacently laminated to each other and characterized by X and Y signal planes disposed about an internal power plane, each of said sub-assemblies having a dielectric between said signal and power planes to bond said signal and power planes, and vias disposed within each sub-assembly for providing electrical communication between said signal planes, and whereby a dielectric layer is located between the signal plane in one of the sub-assemblies and an adjacent signal plane in an adjacent sub-assembly.

2. The high performance printed circuit board assembly of claim 1, wherein said dielectric layer between signal planes comprises a bonding film.

3. The high performance printed circuit board assembly of claim 1, wherein said dielectric layer between signal planes comprises an epoxy resin.

4. The high performance printed circuit board assembly of claim 2 wherein said bonding film is a low dielectric constant bonding material.

5. A method of constructing a high performance printed circuit board assembly utilizing a modular construction technique, comprising the steps of:
(a) fabricating a first circuitized power core sub-assembly having X-Y signal planes disposed about an internal plane and separated therefrom by means of a dielectric layer; and wherein said X-Y signal planes are electrically connected by plated vias;
(b) repeating step (a) to form a number of sub-assemblies;
(c) laminating at least two sub-assemblies together to form a composite whereby a signal plane of one sub-assembly is adjacent to a signal plane of another sub-assembly; and
(d) constructing a printed circuit board assembly by building a multi-laminate structure using said composite.

6. The method of constructing a high performance printed circuit board assembly in accordance with claim 5, further comprising the step of:
(e) testing each respective sub-assembly for electrical integrity prior to the laminating step (c).

7. The method of constructing a high performance printed circuit board assembly in accordance with claim 5, wherein the fabrication of each sub-assembly of step (a) further comprises the steps of:
(i) perforating a first conductive sheet having two outer surface with a power plane configuration;
(ii) laminating by layer of dielectric a second conductive sheet on each of said outer surfaces of said first perforated conductive sheet to form a core with said dielectric separating said second conductive sheet from an outer surface of said first perforated conductive sheet;
(iii) circulating said outer conductive sheets of the core to form a first sub-assembly;
(iv) fabricating a second sub-assembly by repeating steps (i), (ii) and (iii); and
(v) laminating said first and second sub-assemblies together to form a triplate construction.

8. The method of constructing a high performance printed circuit board assembly, in accordance with claim 7, further comprising the step of:
(vi) fabricating plated vias in each of said sub-assemblies where necessary.

9. The method of constructing a high performance printed circuit board assembly in accordance with claim 8, further comprising the step of:
(vii) testing each of said sub-assemblies for electrical integrity.

10. The method of constructing a high performance printed circuit board assembly in accordance with claim 7, wherein the laminating of the first and second sub-assemblies together in step (v) includes the use of a bonding film.

11. The method of constructing a high performance printed circuit board assembly in accordance with claim 7, wherein the laminating of the first and second sub-assemblies together in step (v) includes the use of an epoxy resin.

12. The method of constructing a high performance printed circuit board assembly in accordance with claim 5, wherein the laminating step (c) comprises the use of a bonding film for laminating said sub-assemblies.

13. The method of constructing a high performance printed circuit board assembly in accordance with claim 5, wherein the laminating step (c) comprises the use of an epoxy resin for laminating said sub-assemblies.

14. The method of claim 10 wherein said bonding film is a low dielectric-strength bonding material.

15. The method of claim 12 wherein said bonding film is a low dielectric-strength bonding material.

* * * * *